United States Patent
Le

(10) Patent No.: US 9,253,900 B2
(45) Date of Patent: *Feb. 2, 2016

(54) HARDWARE CASING WITH SPRING LOADED FRICTION FITTING COVER

(71) Applicant: AMX LLC, Richardson, TX (US)

(72) Inventor: Phong Le, Lewisville, TX (US)

(73) Assignee: AMX LLC, Richardson, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 14/672,439

(22) Filed: Mar. 30, 2015

(65) Prior Publication Data

US 2015/0208520 A1    Jul. 23, 2015

Related U.S. Application Data

(63) Continuation of application No. 13/709,934, filed on Dec. 10, 2012, now Pat. No. 8,993,886.

(51) Int. Cl.

| H05K 5/03 | (2006.01) |
|---|---|
| H05K 5/00 | (2006.01) |
| H05K 9/00 | (2006.01) |
| H05K 7/18 | (2006.01) |
| H05K 7/14 | (2006.01) |
| H05K 5/02 | (2006.01) |

(52) U.S. Cl.
CPC ............ *H05K 5/0013* (2013.01); *H05K 5/0004* (2013.01); *H05K 5/0247* (2013.01); *H05K 5/03* (2013.01); *H05K 7/1422* (2013.01)

(58) Field of Classification Search
CPC ......... H02G 3/14; H02G 3/081; H02G 3/086; H01R 13/447; H05K 5/0013; H05K 5/0004; H05K 5/0247; H05K 5/03; H05K 7/1422

USPC ......... 174/50, 66, 67, 350; 361/801, 816, 818
See application file for complete search history.

(56) References Cited

U.S. PATENT DOCUMENTS

| 3,745,664 | A | * | 7/1973 | Altseimer | H02G 3/14 220/3.4 |
|---|---|---|---|---|---|
| 4,059,328 | A | * | 11/1977 | Rigo | H02B 1/42 174/53 |
| 4,953,733 | A | * | 9/1990 | Loscuito | H02G 1/00 220/3.4 |
| 5,301,437 | A | * | 4/1994 | Burke | G01B 3/14 33/528 |
| 5,526,952 | A | * | 6/1996 | Green | H02G 3/14 220/241 |
| 5,639,991 | A | * | 6/1997 | Schuette | H02G 3/12 174/58 |
| 6,103,974 | A | * | 8/2000 | Erdfarb | H02G 3/14 174/66 |
| 6,146,179 | A | * | 11/2000 | Denny | H01R 13/6335 439/350 |
| 6,653,566 | B2 | * | 11/2003 | Petak | H02G 3/12 174/66 |
| 7,456,359 | B1 | * | 11/2008 | Tidd | H02G 3/14 174/66 |
| 2003/0136575 | A1 | * | 7/2003 | Murr | H05K 3/34 174/66 |
| 2006/0211451 | A1 | * | 9/2006 | Pak | H02G 3/123 455/561 |

* cited by examiner

*Primary Examiner* — Sherman Ng

(57) ABSTRACT

Disclosed is a hard-framed housing that provides a cover for electronic hardware components. According to one example, the housing may include a front cover portion that includes at least two spring loaded friction inducing side arms extending from a faceplate portion of the front cover portion at approximately a 90 degree angle. The housing may also include a rear cover portion that includes at least two receiving plates which provide a planar surface for the at least two spring loaded friction inducing side arms to rest when the front cover portion is engaged with the rear cover portion.

20 Claims, 4 Drawing Sheets

HARDWARE CASING WITH SPRING LOADED FRICTION FITTING COVER

CROSS-REFERENCE TO RELATED APPLICATIONS

The present invention is a continuation of U.S. application Ser. No. 13/709,934, filed on Dec. 10, 2012, titled HARDWARE CASING WITH SPRING LOADED FRICTION FITTING COVER, now issued U.S. Pat. No. 8,993,886, issued on Mar. 31, 2015, the entire contents of which are incorporated by reference herein.

TECHNICAL FIELD OF THE APPLICATION

The present disclosure relates to a spring loaded friction fitting cover that may be attachable and detachable from a rear cover to form a protective device housing, which provides protection and allows quick access to the components housed inside the enclosure.

BACKGROUND OF THE APPLICATION

Conventionally, hardware control boxes, covers for devices and related components are fitted into place and secured by one or more semi-permanent fasteners (i.e., screws). A device housing must be kept in-place to protect the fragile components located inside the housing. The ease of access to the internal components stored in a device housing has always been a concern for maintenance personnel and other individuals who need to take the cover off the housing and access the internal components located inside. Those housings which have one or more semi-permanent fasteners engaging the front and/or the back portion of the housing take extra time to remove and set back into position.

SUMMARY OF THE APPLICATION

One embodiment of the present application may include a housing apparatus configured to cover one or more electronic hardware components. The apparatus may include a front cover portion having at least two spring loaded friction inducing side arms extending from a faceplate portion of the front cover portion. The housing may also have a rear cover portion comprising at least two receiving plates which provides a planar surface for the at least two spring loaded friction inducing side arms to rest when the front cover portion is engaged with the rear cover portion.

DETAILED DESCRIPTION OF THE APPLICATION

It will be readily understood that the components of the present application, as generally described and illustrated in the figures herein, may be arranged and designed in a wide variety of different configurations. Thus, the following detailed description of the embodiments of a housing apparatus, as represented in the attached figures, is not intended to limit the scope of the application as claimed, but is merely representative of selected embodiments of the application.

The features, structures, or characteristics of the application described throughout this specification may be combined in any suitable manner in one or more embodiments. For example, the usage of the phrases "example embodiments", "some embodiments", or other similar language, throughout this specification refers to the fact that a particular feature, structure, or characteristic described in connection with the embodiment may be included in at least one embodiment of the present application. Thus, appearances of the phrases "example embodiments", "in some embodiments", "in other embodiments", or other similar language, throughout this specification do not necessarily all refer to the same group of embodiments, and the described features, structures, or characteristics may be combined in any suitable manner in one or more embodiments.

Figure 1:
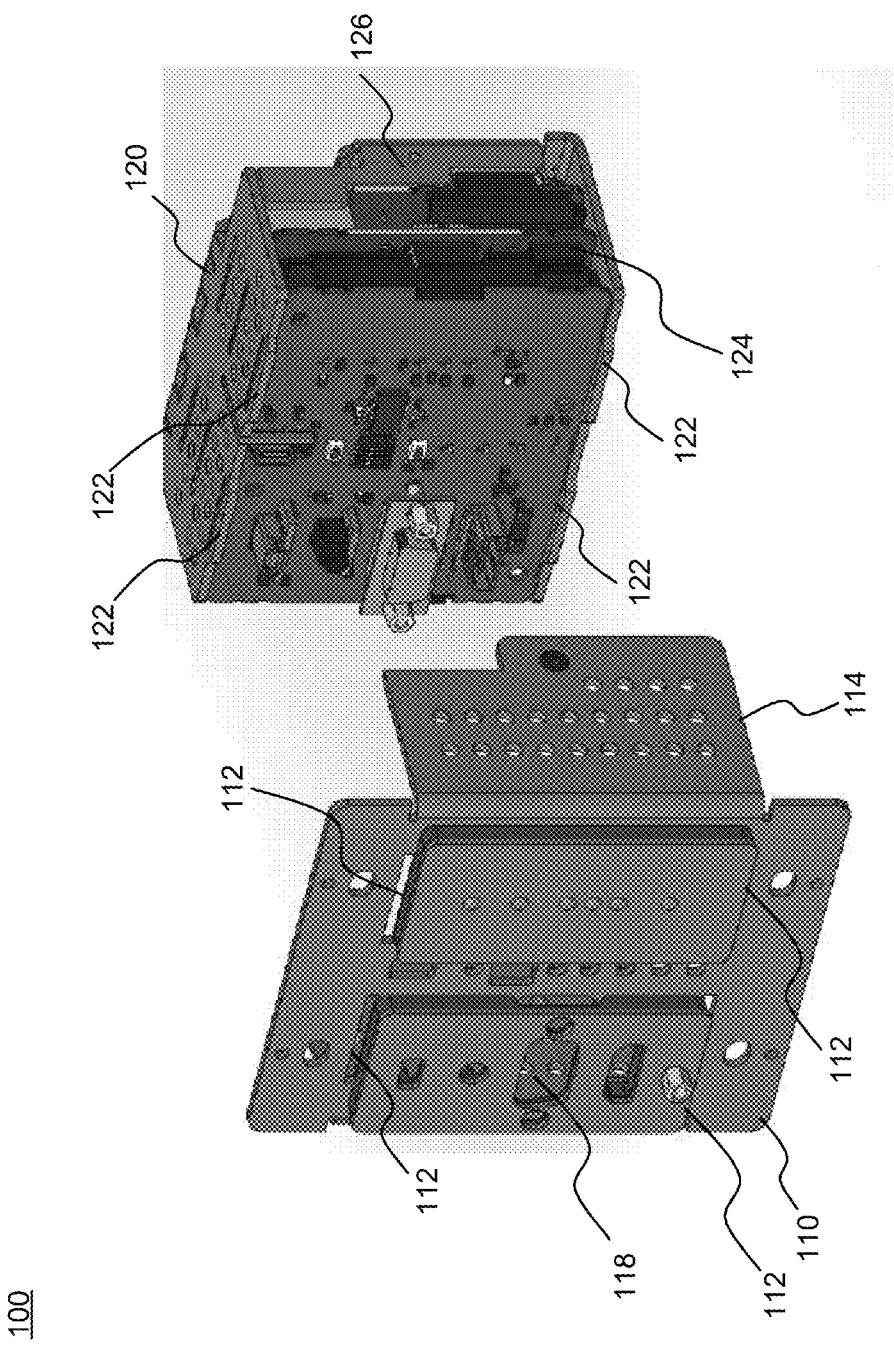
FIG. 1 illustrates an example front perspective of the front cover and the rear cover portions of the housing in an open configuration.

FIG. 1 illustrates an example front perspective of the front cover and the rear cover portions of the housing in an open configuration. Referring to FIG. 1, the front perspective configuration 100 includes a front cover portion of the housing 110 and a rear cover portion of the housing 120. Together the front cover 110 and the rear cover 120 may be combined to create a square, rectangle, circle, oval, etc., shaped housing where hardware components (e.g., circuit boards, electronics, chips, device interfaces, etc.) are placed inside and are protected from foreign objects or other types of physical interference.

The front cover may have at least two spring loaded arms 114 extending from either side of the front cover, and a plurality of receiving slots 112 which provide additional support when matched with the protruding slot inserts 122 on the rear housing cover 120. One or more electronic device interfaces 118 may be accessible from the front cover 110. When the front cover 110 is engaged with the rear cover 120, the side arm resting surfaces 126 may be located on at least two sides of the rear cover 120 and may provide a friction inducing surface for the side arms 114 to rest when the cover is in the closed position. An array of electronic circuit boards and cards may be stacked inside the voluminous area provided by the engaged front and rear covers.

Figure 2:
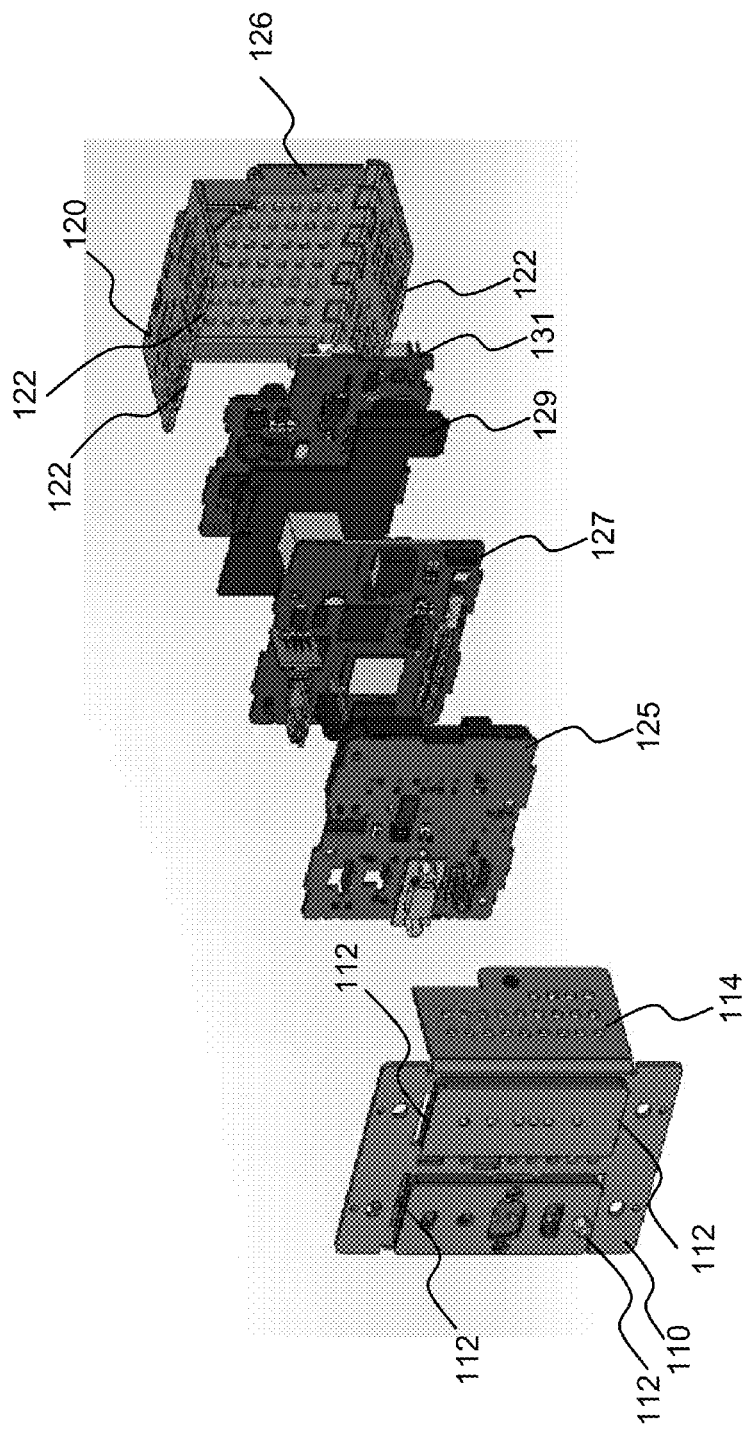
FIG. 2 illustrates an exploded view of the front perspective of the front cover and the rear cover portions of the housing in an open configuration.

FIG. 2 illustrates an exploded view 200 of the front perspective of the front cover and the rear cover portions of the housing in an open configuration. Referring to FIG. 2, like numerals refer to like components. In this example, the various circuit boards and cards 125, 127, 129 and 131 may be stacked together to fit into the compartment provided by the front and rear housing compartments in the closed position. The housing may provide protection from foreign objects, electromagnetic interference, extreme temperature variations, etc. In the event that any of the device cards 125-131 may fail, the front cover may be removed from the rear cover by pinching or lifting the spring loaded side arms so the front cover may be removed from the rear cover without any screws or other semi-permanent fasteners being used.

Figure 3:
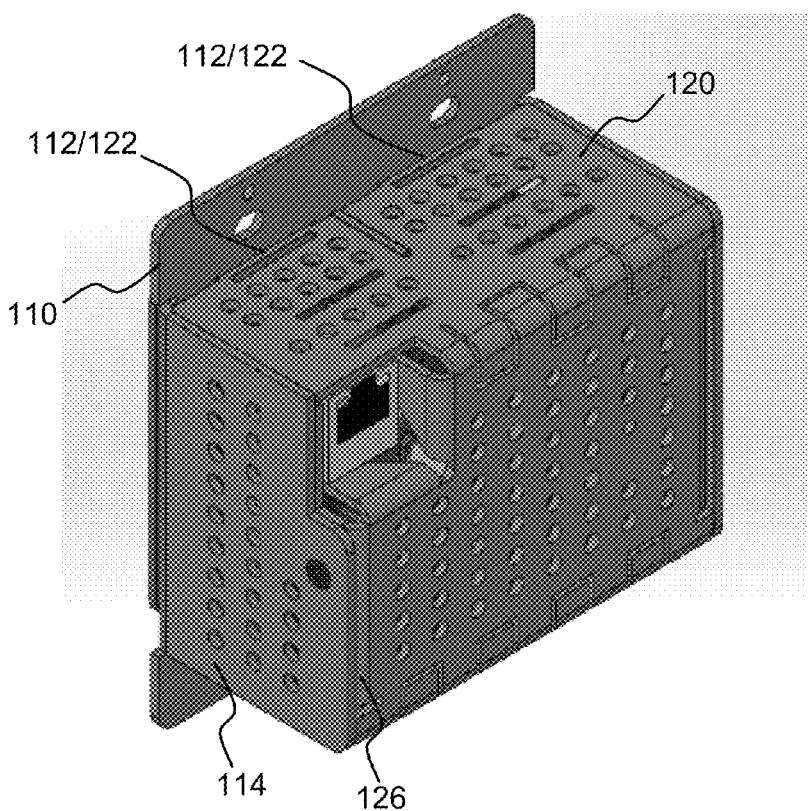
FIG. 3 illustrates an example rear perspective of the front cover and the rear cover in a closed configuration.

FIG. 3 illustrates an example rear perspective of the front cover and the rear cover in a closed configuration. Referring to FIG. 3, the front and rear covers are engaged and are bound together by friction and gravity. For example, the side arms 114 may have a bending tendency to hold firmly to the resting plates 126 on at least two sides of the rear cover. The angles of the side arms 114 may be 90 degrees or greater to create a bendable structure that may be lifted onto the rear cover resting plates 126 to provide a friction fit. For example, tighter angles may be greater than 90 degrees, such as 95 or even 100 degrees. The metal of the front cover may be flexible and may be bent enough to slide over the rear cover where the angle would change from 95 or 100 degrees to 90 degrees with a tight fit over the resting plates 126 of the rear cover 120. The receiving slots 112 may have the protruding slot inserts 122 engaged to create a tight fit based on gravity. Alternatively, the rear cover 120 may be spring loaded to have the protruding slot inserts 122 bent slightly inward so the front cover would have to be pressed against the front of the rear cover to allow the slot inserts to fit into the receiving slots 112. Once the slot inserts 122 are placed into the receiving slots 112, the tension from the spring loaded rear cover 120 would hold the front cover 110 in place based on the engagement of the receiving slots and slot inserts alone. This configuration provides a secondary spring loaded mechanism to keep the front cover 110 engaged with the rear cover 120 in the absence of any screws.

Figure 4:
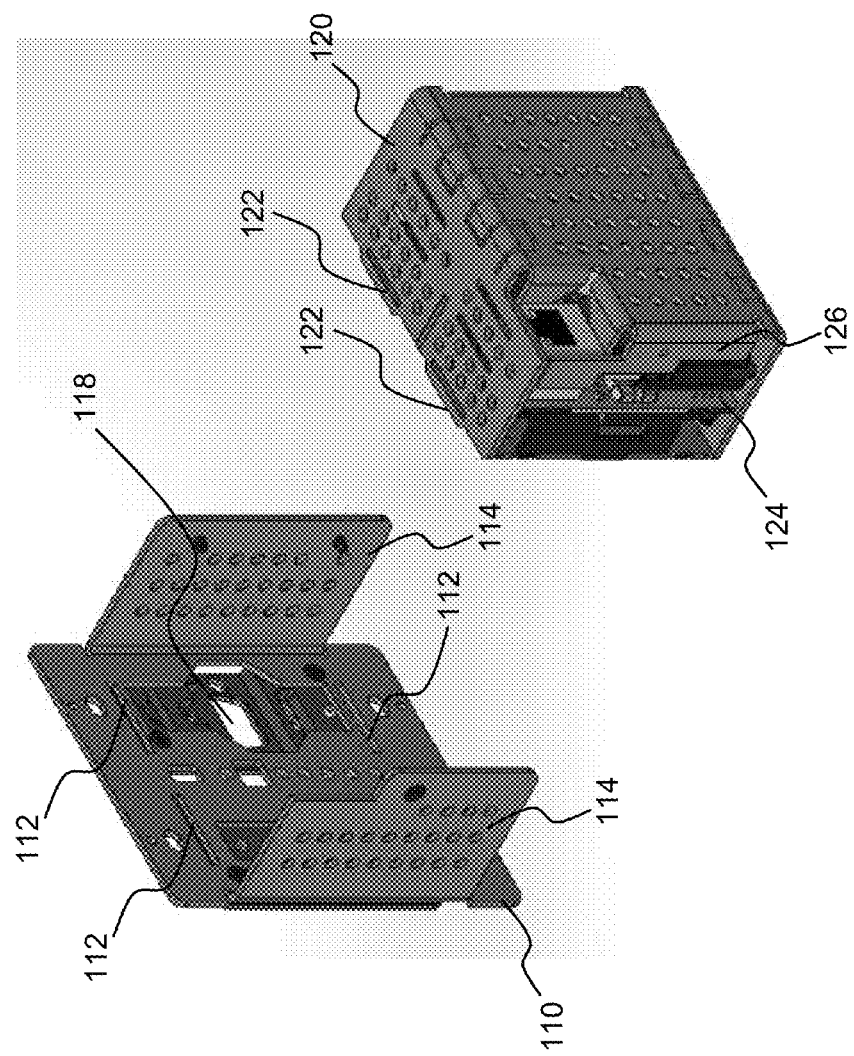
FIG. 4 illustrates an example rear perspective of the front cover and the rear cover portions of the housing in an open configuration.

FIG. 4 illustrates an example rear perspective of the front cover and the rear cover portions of the housing in an open configuration. Referring to FIG. 4, this rear perspective 400 illustrates how the device interfaces 116 may be accessible through the front cover 110 while the covers are engaged to form the housing and protect the electronic card array 124.

According to one example embodiment, the housing may provide a cover for one or more electronic hardware components. The housing may include a front cover portion that includes at least two spring loaded friction inducing side arms extending from a faceplate portion of the front cover portion. The friction inducing side arms of the front cover may be between one and twelve inches long and may extend from the front of the front cover portion at a 90 degree angle or at an angle greater than a 90 degree angle with respect to a planar surface of a faceplate portion of the front cover to provide tension and a spring loaded fitting with the rear cover portion. The housing may also include a rear cover portion that has at least two receiving plates which provide a planar surface for the at least two spring loaded friction inducing side arms to rest when the front cover portion is engaged with the rear cover portion.

According to another example, the at least two spring loaded friction inducing side arms may be located on side portions of the front cover portion and extend at approximately a ninety degree angle from the planar portion of the faceplate. Or, the two spring loaded friction inducing side arms may extend at approximately 95-100 degrees from the planar portion of the faceplate (front portion of the front cover). The at least two spring loaded friction inducing side arms may instead by located on top and bottom portions of the front cover portion and extend at approximately a ninety degree angle from the planar portion of the faceplate or at approximately 95-100 degrees from the planar portion of the faceplate.

The front cover portion may also include at least one access portion that includes a plurality of access slots providing access to a plurality of hardware device interfaces. The front cover portion may also include a plurality of receiving slots on at least two sides of the access slots. The rear cover portion may include a plurality of protruding inserts that fit inside the surface area of the plurality of receiving slots of the front cover portion to form an enclosed housing.

The plurality of protruding inserts provide a gravitational support for the front cover portion when placed into the plurality of receiving slots of the rear cover. The mere resting of the slot inserts inside the receiving slots may provide a gravity force great enough to support the weight of the front cover against the rear cover. Alternatively, the protruding inserts may be bent an angle that induces a friction force when engaged with the receiving slots of the front cover. The access slots provide access to at least one of a FIREWIRE interface, a USB interface, a VGA interface, a PCI interface, a video/audio interface and a HDMI interface affixed to the at least one hardware components stored inside the housing. The rear cover may also be spring loaded so the protruding inserts are slightly angled inward providing a spring loaded fit into the front cover. In this example, the rear cover would be squeezed inward to allow the spring loaded protruding inserts to fit into the receiving slots of the front cover. Once the inserts are fitted into the receiving slots, the rear cover may be locked into position by the spring loaded angle of the slot inserts. Also, the front cover may be spring loaded onto the rear cover via the spring loaded side arms which are placed over the receiving plates of the rear cover to provide an additional level of spring loaded friction.

According to another example embodiment, the front cover may be angled and/or formed to securely attach/detach to the rear cover without any predefined spring loaded coefficient created by the front and/or rear cover. For example, the receiving slots on the front cover may be readily secured to the protruding slot insets of the rear cover without a spring coefficient. Additionally, the front and rear cover may be formed together to create a secure housing by magnets located on the rear cover receiving plates and/or the receiving slots of the front cover.

While preferred embodiments of the present application have been described, it is to be understood that the embodiments described are illustrative only and the scope of the application is to be defined solely by the appended claims when considered with a full range of equivalents and modifications thereto.

What is claimed is:

1. An apparatus, comprising: a front cover portion comprising at least two spring loaded friction inducing side arms that extend from a faceplate portion of the front cover portion; a rear cover portion comprising at least two receiving plates which provide a surface for the at least two spring loaded friction inducing side arms to rest when the front cover portion is engaged with the rear cover portion; at least one access portion comprising a plurality of access slots that provide access to a plurality of hardware device interfaces; a plurality of receiving slots on at least two sides of the access slots; and a plurality of protruding inserts that fit inside an area of the plurality of receiving slots of the front cover portion; wherein the plurality of protruding inserts provide a support for the front cover portion when placed into the plurality of receiving slots; wherein the access slots provide access to at least one of a FIREWIRE interface, a USB interface, a VGA interface, a PCI interface, a video/audio interface and a HDMI interface affixed to the at least one hardware components.

2. The apparatus of claim 1, wherein the at least two spring loaded friction inducing side arms are located on side portions of the front cover portion and extend at approximately a ninety degree angle from a planar portion of the faceplate.

3. The apparatus of claim 2, wherein the two spring loaded friction inducing side arms extend at approximately 95-100 degrees from a planar portion of the faceplate.

4. The apparatus of claim 1, wherein the at least two spring loaded friction inducing side arms are located on top and bottom portions of the front cover portion and extend at approximately a ninety degree angle from a planar portion of the faceplate.

5. The apparatus of claim 4, wherein the two spring loaded friction inducing side arms extend at approximately 95-100 degrees from a planar portion of the faceplate.

6. The apparatus of claim 1, wherein the apparatus is a housing apparatus.

7. The apparatus of claim 1, wherein the apparatus is configured to cover one or more electronic hardware components.

8. The apparatus of claim 1, wherein the surface for the at least two spring loaded friction inducing side arms to rest is a planar surface.

9. The apparatus of claim 1, wherein the at least two spring loaded side arms are friction inducing.

10. The apparatus of claim 1, wherein the support is a gravitational support for the front cover portion when placed into the plurality of receiving slots.

11. An apparatus, comprising: a first cover portion comprising at least two spring loaded friction inducing side arms that extend from a faceplate portion of the first cover portion; a second cover portion comprising at least two receiving plates which provide a surface for the at least two spring loaded friction inducing side arms to rest when the first cover portion is engaged with the second cover portion; at least one access portion comprising a plurality of access slots that provide access to a plurality of hardware device interfaces; a plurality of receiving slots on at least two sides of the access slots; and a plurality of protruding inserts that fit inside an area of the plurality of receiving slots of the first cover portion; wherein the plurality of protruding inserts provide a support for the first cover portion when placed into the plurality of receiving slots; wherein the access slots provide access to at least one of a FIREWIRE interface, a USB interface, a VGA interface, a PCI interface, a video/audio interface and a HDMI interface affixed to the at least one hardware components.

12. The apparatus of claim 11, wherein the at least two spring loaded friction inducing side arms are located on side portions of the first cover portion and extend at approximately a ninety degree angle from a planar portion of the faceplate.

13. The apparatus of claim 12, wherein the two spring loaded friction inducing side arms extend at approximately 95-100 degrees from a planar portion of the faceplate.

14. The apparatus of claim 11, wherein the at least two spring loaded friction inducing side arms are located on top and bottom portions of the first cover portion and extend at approximately a ninety degree angle from a planar portion of the faceplate.

15. The apparatus of claim 14, wherein the two spring loaded friction inducing side arms extend at approximately 95-100 degrees from a planar portion of the faceplate.

16. The apparatus of claim 11, wherein the apparatus is a housing apparatus.

17. The apparatus of claim 11, wherein the apparatus is configured to cover one or more electronic hardware components.

18. The apparatus of claim 11, wherein the surface for the at least two spring loaded friction inducing side arms to rest is a planar surface.

19. The apparatus of claim 11, wherein the at least two spring loaded side arms are friction inducing.

20. The apparatus of claim 11, wherein the support is a gravitational support for the first cover portion when placed into the plurality of receiving slots.

* * * * *